US012667010B2

(12) United States Patent
Simpson et al.

(10) Patent No.: US 12,667,010 B2
(45) Date of Patent: Jun. 23, 2026

(54) SEMICONDUCTOR DEVICE

(71) Applicants: DYNEX SEMICONDUCTOR LIMITED, Lincoln (GB); ZHUZHOU CRRC TIMES SEMICONDUCTOR CO. LTD, Zhuzhou (CN)

(72) Inventors: Robin Adam Simpson, Lincoln (GB); Michael David Nicholson, Lincoln (GB); Yangang Wang, Lincoln (GB)

(73) Assignees: DYNEX SEMICONDUCTOR LIMITED, Lincoln (GB); ZHUZHOU CRRC TIMES SEMICONDUCTOR CO. LTD, Hunan (CN)

( * ) Notice: Subject to any disclaimer, the term of this patent is extended or adjusted under 35 U.S.C. 154(b) by 651 days.

(21) Appl. No.: 18/009,383

(22) PCT Filed: May 28, 2021

(86) PCT No.: PCT/EP2021/064440
§ 371 (c)(1),
(2) Date: Dec. 9, 2022

(87) PCT Pub. No.: WO2022/248068
PCT Pub. Date: Dec. 1, 2022

(65) Prior Publication Data
US 2023/0260962 A1     Aug. 17, 2023

(51) Int. Cl.
*H10W 90/00* (2026.01)
*H10W 42/00* (2026.01)
(Continued)

(52) U.S. Cl.
CPC ......... *H10W 90/00* (2026.01); *H10W 42/121* (2026.01); *H10W 70/20* (2026.01);
(Continued)

(58) Field of Classification Search
CPC ... H01L 23/562; H01L 23/367; H01L 23/072; H01L 23/492; H01L 23/051;
(Continued)

(56) References Cited

U.S. PATENT DOCUMENTS 4,887,149 A * 12/1989 Romano' ............. H10W 40/611
257/730
9,818,705 B1 * 11/2017 Kuwahara ........... H10W 42/121
(Continued)

FOREIGN PATENT DOCUMENTS

EP      1393373 A1      3/2004
WO   2017220949 A1   12/2017

OTHER PUBLICATIONS

International Search Report and Written Opinion issued in connection with corresponding PCT Patent Application No. PCT/EP2021/064440 dated May 3, 2022.
(Continued)

*Primary Examiner* — Dale E Page
*Assistant Examiner* — Genevieve G Bullard-Connor
(74) *Attorney, Agent, or Firm* — Tarolli, Sundheim, Covell & Tummino LLP

(57) ABSTRACT

There is provided a semiconductor device 1, comprising: a housing comprising a first housing electrode 4 and a second housing electrode 5 arranged at opposite sides of the housing; and a plurality of semiconductor units 30 arranged within the housing between the first and second housing electrodes 4, 5 and coupled to at least one of the first and second housing electrodes 4, 5 by pressure, wherein the plurality of semiconductor units 30 comprise a first semiconductor unit 30-1 and a second semiconductor unit 30-2 neighbouring the first semiconductor unit 30-1; wherein the first and/or second housing electrode comprises a plurality of pillars 10, and the plurality of pillars comprise a first pillar
(Continued)

10-1 and a second pillar 10-2 electrically coupled to the first and second semiconductor units 30-1, 30-2, respectively, and wherein a surface 16 of the first housing electrode 4 comprises a groove 15, and a width W1 of the groove 15 is less than a spacing S2 between the first pillar 10-1 and the second pillar 10-2.

17 Claims, 4 Drawing Sheets

(51) Int. Cl.

| | |
|---|---|
| *H10W 70/20* | (2026.01) |
| *H10W 72/30* | (2026.01) |
| *H10W 76/12* | (2026.01) |
| *H10W 76/138* | (2026.01) |

(52) U.S. Cl.
CPC ......... *H10W 76/12* (2026.01); *H10W 76/138* (2026.01); *H10W 72/352* (2026.01); *H10W 90/736* (2026.01)

(58) Field of Classification Search
CPC . H10W 42/121; H10W 70/20; H10W 72/352; H10W 76/12; H10W 76/138; H10W 90/00; H10W 90/736
See application file for complete search history.

(56) References Cited

U.S. PATENT DOCUMENTS

| | | | | |
|---|---|---|---|---|
| 2008/0296774 A1* | 12/2008 | Kellner-Werdehausen | ................. | H10W 76/138 |
| | | | | 257/773 |
| 2016/0247736 A1* | 8/2016 | Kuwahara | ............. | H10W 76/10 |
| 2020/0091141 A1* | 3/2020 | Itakura | ................. | H10D 84/403 |
| 2021/0082778 A1* | 3/2021 | Kaji | .................... | H10W 76/136 |
| 2021/0398950 A1* | 12/2021 | Nakata | .................. | H10W 90/00 |
| 2023/0119278 A1* | 4/2023 | Tsuyuno | .............. | H02M 7/003 |
| | | | | 257/675 |
| 2024/0079372 A1* | 3/2024 | Omae | ................. | H10W 74/114 |

OTHER PUBLICATIONS

Tinschert, et al., "Possible failure modes in Press-Pack IGBTs", Microelectronics Reliability, vol. 55, Issue 6, May 2015, pp. 903-911, doi.org/10.1016/j.microrel.2015.02.019.
Poller, et al., "Influence of the clamping pressure on the electrical, thermal and mechanical behaviour of press-pack IGBTs", Microelectronics Reliability, vol. 53, Issues 9-11, Sep.-Nov. 2013, pp. 1755-1759, doi.org/10.1016/j.microrel.2013.07.130.
Deng, et al., "Influence of Temperature on the Pressure Distribution within Press Pack IGBTs", IEEE Transactions on Power Electronics, vol. 33 Issue 7Jul. 2018, pp. 6048-6059, Published Sep. 6, 2017, DOI: 10.1109/TPEL.2017.2749521.

* cited by examiner

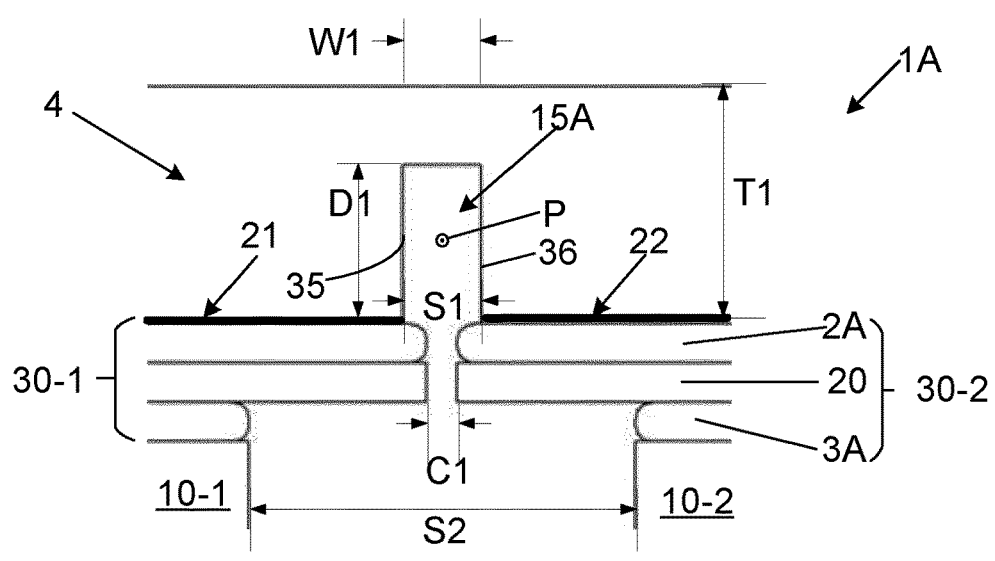
Figure 6
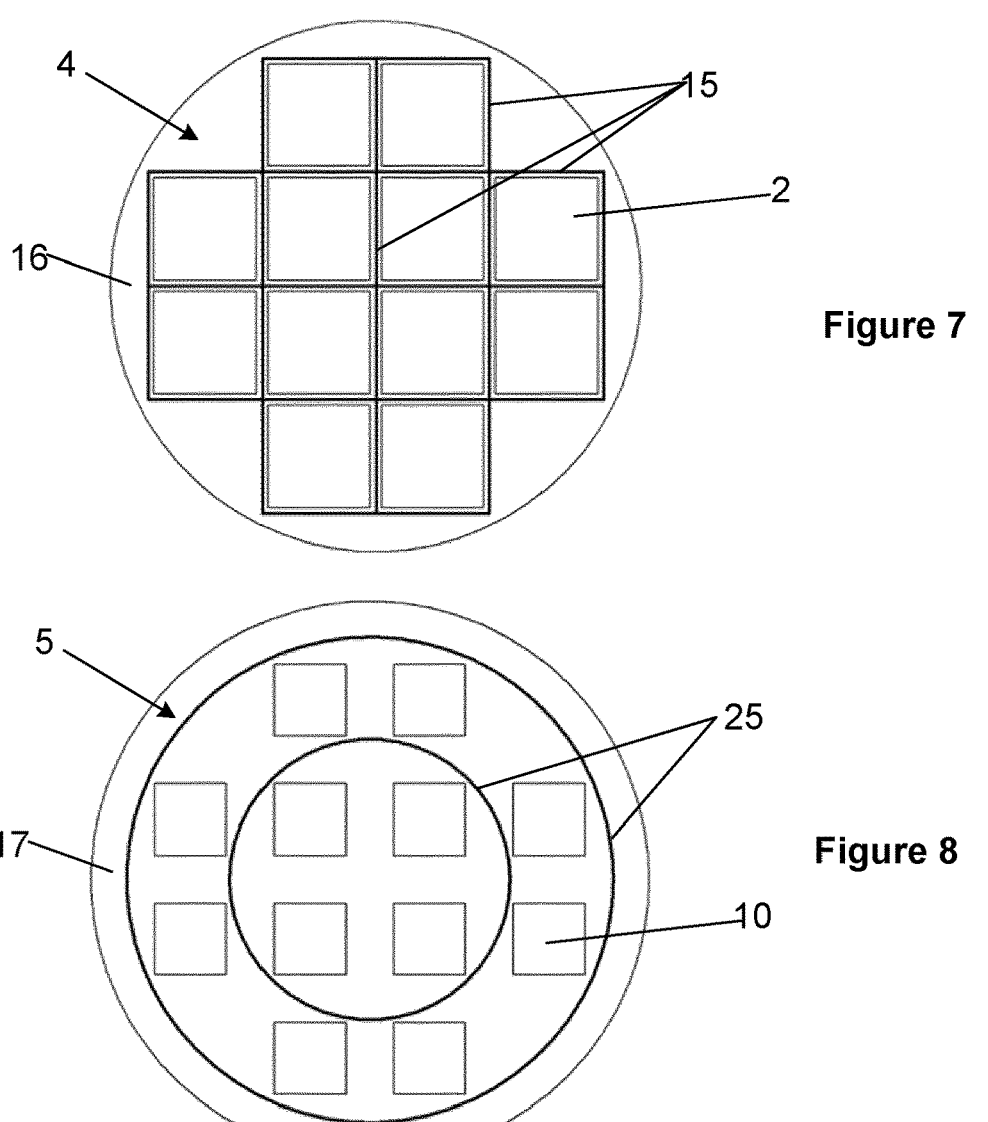
Figure 7
Figure 8

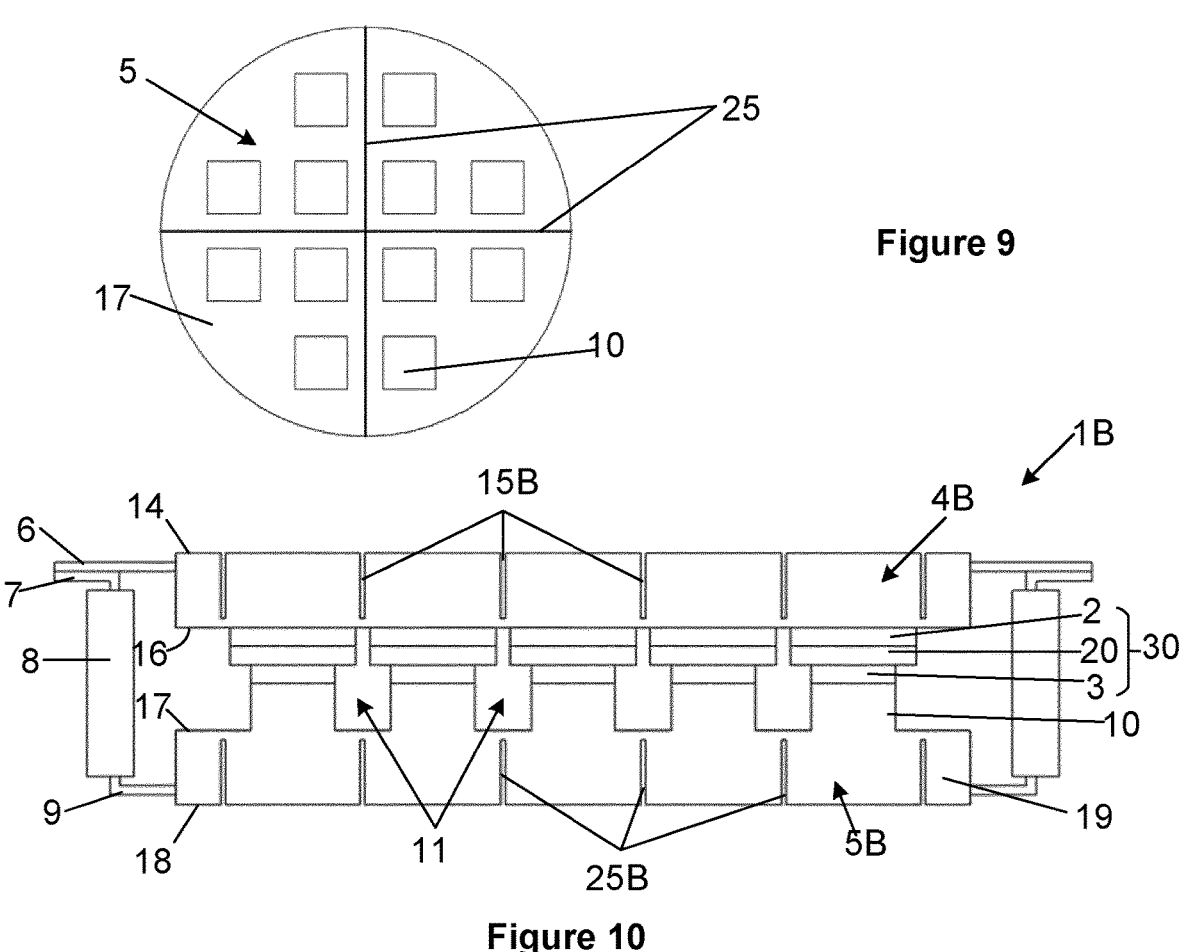

| | | S1 |
| --- | --- | --- |
| Providing a housing which comprises a first housing electrode and a second housing electrode arranged at opposite sides of the housing | | |

| | | S2 |
| --- | --- | --- |
| Arranging a plurality of semiconductor units within the housing and between the first and second housing electrodes, the plurality of semiconductor units comprising a first semiconductor unit and a second semiconductor unit neighbouring the first semiconductor unit | | |

| | | S3 |
| --- | --- | --- |
| Coupling at least one of the first and second housing electrodes to the plurality of semiconductor units by pressure, wherein the first and/or second housing electrode comprises a plurality of pillars, and the plurality of pillars comprise a first pillar and a second pillar electrically coupled to the first and second semiconductor units, respectively, and wherein a surface of the first housing electrode comprises a groove, and a width of the groove is less than a spacing between the first pillar and the second pillar | | |

Figure 11

SEMICONDUCTOR DEVICE

RELATED APPLICATIONS

The present invention is a U.S. National Stage under 35 USC 371 patent application, claiming priority to PCT Application No. PCT/EP2021/064440, filed on May 28, 2021; the entirety of which is hereby incorporated herein by reference.

TECHNICAL FIELD

The present disclosure relates to a semiconductor device. More particularly, but not exclusively, the present disclosure relates to a pressure-contact power semiconductor device which mitigates thermal warpage effects and ensures uniform distribution of contact pressure across all chips within the device.

BACKGROUND

A power semiconductor device may house one or more power semiconductor chips (or dies). The power semiconductor chips are often used to switch high currents and voltages, and may include one or more of a power transistor, a power diode, and a thyristor, etc. A power transistor includes, but is not limited to, a power metal-oxide-semiconductor field effect transistor (MOSFET), a power bipolar junction transistor (BJT), and an insulated gate bipolar transistor (IGBT), etc. A thyristor includes, but is not limited to, an integrated gate-commutated thyristor (IGCT), and a gate turn-off thyristor (GTO), etc. The power semiconductor device may also be referred to as a power module or a power electronic module.

FIG. 1 schematically illustrates a sectional view of a known power semiconductor device 100 which has a press-pack package. Press-pack power semiconductor devices are an alternative to traditional isolated-base power semiconductor devices, in which power semiconductor chips are typically soldered on isolated substrates that carry the chips respectively and are also wire-bonded to the substrates. Instead of the wire bonds and solder joints used in isolated-base devices, press-pack devices typically rely on the application of force by an external clamping system, to make contact to the chips. In this sense, the power semiconductor device 100 may also be referred to as a pressure-contact power semiconductor device.

As shown in FIG. 1, the press-pack power semiconductor device 100 comprises a plurality of semiconductor chips 120. Individual semiconductor chips 120 are connected in parallel within a single pressure contact housing to produce a single device containing multiple chips with a current handling capability that is ideally the sum of the capability of all the chips contained within the housing. The semiconductor chips 120 are placed between mechanical strain buffers 102, 103 to form semiconductor units 130. These semiconductor units 130 are then positioned between upper and lower electrodes 104, 105 in a hermetically-sealed housing which is formed by the electrodes 104, 105, a ceramic tube 108 and thin flanges 106, 107, 109. The thin flanges include a lid flange 106, a housing upper flange 107, and a housing lower flange 109. The thin flanges 106, 107, 109 make a gas-tight, flexible joint between the electrodes 104, 105 and the ceramic tube 108. The upper and lower electrodes 104, 105 may also be referred to as housing electrodes. The hermetically-sealed housing encloses an internal space 111. The internal space 111 is commonly filled with nitrogen.

It is typical that one electrode (e.g., the upper electrode 104) is flat and the other (e.g., the lower electrode 105) has an array of pillars 110 formed on its inner surface. The semiconductor units 130 typically have upper and lower contact regions of differing areas. As shown in FIG. 1, the pillars 110 of the lower electrode 105 permit contact to the smaller area at the bottom surfaces of the semiconductor units 130.

In operation, the semiconductor chips 120 are electrically and thermally connected between the upper and lower electrodes 104, 105 by pressure. One or both of the interface between the semiconductor units 130 and the upper electrode 104, and the interface between the semiconductor units 130 and the lower electrode 105 are dry interfaces. A dry interface means that elements at opposite sides of the interface are coupled by pressure, and there is no bonding material between the elements. For optimum current handling capability and product reliability, the pressure distribution across the chips 120 within the device 100 should be as uniform as possible. However, self-heating effects in the device 100 result in thermal warpage of the electrodes 104, 105, causing a pressure imbalance across the chips 120. The thermal warpage of the electrodes 104 and 105 is illustrated in FIG. 2.

The cause of the thermal warpage is described below with reference to FIG. 2. When the device 100 is in operation, heat is generated in the semiconductor chips 120. Meanwhile, cooling devices (e.g., water-cooled heat sinks) are mechanically pressed against external surfaces of the housing electrodes 104, 105 to remove heat from the device 100. Consequently, temperature gradients are established along a direction Y1 from the hot chips 120 to the external surface of the upper electrode 104 and along a direction Y2 from the chips 120 to the external surface of the lower electrode 105. The temperature gradients lead to differential thermal expansions through the bodies of the housing electrodes 104, 105, causing them to warp, as shown in FIG. 2. When the warpage occurs, the pressure on the chips 120 in the centre of the device 100 increases, while the pressure on those chips 120 at the periphery of the device 100 is reduced. The variation in pressure across the chips 120 leads to differences in electrical and thermal contact resistances, resulting in current imbalance between the chips 120 and a reduction in performance and reliability of the device 100. It has been found that premature failures of the device 100 result from a mixture of over-pressurisation and under-pressurisation of certain chips 120 in the device 100. Over-pressurisation typically effects chips located at the centre of the device 100. Under-pressurisation particularly affects chips located at the periphery of the device 100.

The force generated by thermal warpage of a housing electrode is determined primarily by a magnitude of the relevant temperature gradient and a thickness of the housing electrode. The temperature gradient is determined by the power dissipation in the chips 120 and the thermal conductivity of the housing electrode. The power dissipation in the chips 120 is determined primarily by the operating conditions of a power electronics system incorporating the device 100, so cannot be reduced by packaging design measures. The housing electrodes 104, 105 are typically manufactured from copper, which has very high thermal conductivity. It is unfeasible to manufacture the electrodes 104, 105 from a material with higher conductivity such as silver, due to material costs. Therefore, it is difficult to mitigate the thermal warpage of the housing electrodes 104, 105 by reducing the magnitude of the temperature gradients. It is generally desirable that a press-pack device such as the device 100 has a certain thickness to maintain compatibility with existing power electronics systems and with similar products offered by other manufacturers. For example, a common package outline of the device 100 may be nominally 26.5 mm tall, while a combined thickness of the semiconductor unit 130 is typically between 1 mm and 5 mm. This means that the combined thickness of the two housing electrodes 104, 105 is typically in the order of 20 mm. It is not possible to reduce the thickness of the housing electrode 104 or 105 while maintaining the target package height.

There are two known solutions to address the problem of reducing the thermal warpage of the housing electrodes 104, 105 and/or reducing the pressure variations across the chips 120.

The first solution is described with reference to FIG. 3. In the first solution, each housing electrode is split horizontally into multiple thinner electrodes. In the example of FIG. 3, the housing electrode 104 is split into two electrode plates 104A and 104A', the housing electrode 105 is split into an electrode plate 105A and an electrode 105A' (which comprises an electrode plate and pillars 110 extending therefrom). It is known that the total thermal warpage force generated by two thin plates is lower than that generated by a single thicker plate of equivalent total thickness. The first solution reduces the extent of thermal warpage but does not eliminate it entirely. Further, the first solution has the drawback of increasing the thermal resistance of the device 100 due to the inclusion of additional pressure contact interfaces between the split thinner electrodes.

The second solution is disclosed by EP1393373A1 and WO2017/220949A1, and is briefly described below with reference to FIG. 4. In the second solution, an array of spring assemblies 140 is used as a means of applying pressure to the semiconductor units 130. The spring assemblies 140 typically have a maximum stroke of 1 mm or more, whereas the displacement of the electrodes 104, 105 caused by thermal warpage is typically in the order of tens of microns. Therefore, the spring assemblies 140 maintain a high degree of pressure uniformity on the semiconductor chips 120, regardless of the extent of thermal warpage of the housing electrodes 104, 105. The drawback in the use of spring assemblies 140 is the reduction in cooling efficiency, because the spring assemblies 140 (which have poor thermal conductivity) thermally isolate the semiconductor units 130 from the lower electrode 105 and its adjacent heat sink.

With the emergence of new chip technologies that provides increased current ratings and increased power dissipation in pressure-contact power semiconductor devices, maintaining satisfactory uniform distribution of contact pressure across all chips would become even more difficult.

It is an object of the present disclosure, among others, to provide an improved semiconductor device, which solves problems associated with known semiconductor devices, whether identified herein or otherwise.

SUMMARY

According to a first aspect of the present disclosure, there is provided a semiconductor device, comprising: a housing comprising a first housing electrode and a second housing electrode which are arranged at opposite sides of the housing; and a plurality of semiconductor units arranged within the housing between the first and second housing electrodes and coupled to at least one of the first and second housing electrodes by pressure, wherein the plurality of semiconductor units comprise a first semiconductor unit and a second semiconductor unit neighbouring the first semiconductor unit; wherein the first and/or second housing electrode comprises a plurality of pillars, and the plurality of pillars comprise a first pillar and a second pillar electrically coupled to the first and second semiconductor units, respectively; and wherein a surface of the first housing electrode comprises a groove, and a width of the groove is less than a spacing between the first pillar and the second pillar.

Advantageously, the groove weakens the first housing electrode by splitting the first housing electrode into separate regions and preventing the first housing electrode from acting as a single electrode in response to thermal gradients across the thickness of the first housing electrode. Consequently, the thermal warpage of the first housing electrode decreases under the same magnitude of thermal gradients, thereby improving the uniform distribution of contact pressures across the semiconductor units. Uniform distribution of contact pressure across all semiconductor units promotes optimum sharing of electrical, thermal and mechanical stresses between the units and allows the semiconductor units within the device to have the largest safe operating area and the highest reliability.

Since the width of the groove is less than a spacing between the first pillar and the second pillar, the groove is therefore different from the wide gaps which exist between neighbouring pillars in the prior devices.

By the expression "a plurality of semiconductor units . . . coupled to at least one of the first and second housing electrodes by pressure", it is meant that at least one of the first housing electrode and the second housing electrode forms a pressure contact with the plurality of semiconductor units. In other words, there is no bonding material between the semiconductor units and at least one of the housing electrodes, and one or both of the interface between the semiconductor units and the first housing electrode and the interface between the semiconductor units and the second housing electrode are dry interfaces.

By the expression "the first and/or second housing electrode comprises a plurality of pillars", it is meant that one or each of the first and second housing electrodes comprises a plurality of pillars.

It would be appreciated that the first pillar and the second pillar may be coupled to the first and second semiconductor units by pressure, or alternatively may be fixedly bonded to the first and second semiconductor units by, for example, using a bonding material.

The plurality of semiconductor units may be electrically and thermally coupled to one or more of the first and second housing electrodes.

It would be appreciated that the groove does not extend completely through the first housing electrode, and has a depth which is less than a thickness of the first housing electrode.

In this application, the term "spacing" between two elements means an edge-to-edge distance between the two elements.

The term "width" of a groove means a width measured perpendicularly to a longitudinal direction of the groove or to a centre line of the groove. The width of a groove represents the shortest distance between two opposing side walls of the groove.

The width of the groove and the spacing between the first and second pillars may be measured along the same direction which is parallel to the surface of the first housing electrode.

The term "length" of a groove means a length measured along the longitudinal direction or the centre line of the groove. The longitudinal direction of the groove is parallel to the side walls of the groove, and is also parallel to the surface of the first housing electrode.

The term "depth" of a groove means a depth measured along a direction that is perpendicular to the surface of the first housing electrode.

The first housing electrode may comprise an electrode plate. The groove may have a depth which is equal to or greater than approximately 50% of a thickness of the electrode plate.

A depth of the groove may be less than a thickness of the electrode plate by approximately 1 mm or more.

The first housing electrode may further comprise the plurality of pillars, the plurality of pillars extending from an inner surface of the electrode plate into an interior of the housing.

Alternatively, the second housing electrode may comprise a further electrode plate and the plurality of pillars, the plurality of pillars extending from an inner surface of the further electrode plate into an interior of the housing.

The width of the groove may be less than or equal to approximately 2 millimetres.

Generally speaking, the spacing between neighbouring pillars may be around 5 millimetres. By making the width of the groove to be much less than the spacing between the first and second pillars, insignificant amount of material was removed from the first housing electrode in order to create the groove. Accordingly, the thermal and electrical resistances of the first housing electrode would not be significantly impacted by the groove.

The surface of the first housing electrode may be an inner surface of the first housing electrode, with the inner surface facing an interior of the housing.

In particular, the surface of the first housing electrode may be an inner surface of the electrode plate of the first housing electrode.

Alternatively, the surface of the first housing electrode may be an outer surface of the first housing electrode, with the outer surface being exposed to an exterior of the semiconductor device.

The first housing electrode may comprise a first area and a second area contacting the first and second semiconductor units, respectively. The groove may be arranged between the first and second areas.

By the expression "arranged between", it is meant that the groove is located between the first and second areas when viewed along a direction which is perpendicular to the surface of the first housing electrode.

The groove may be equidistant from the first and second areas.

The width of the groove may be greater than a spacing between the first and second semiconductor units. A centre line of the groove may be equidistant from the first and second semiconductor units.

The groove may extend along a circular path on the surface of the first housing electrode.

The groove may extend along a straight path on the surface of the first housing electrode.

The groove may be a first groove, and the surface of the first housing electrode may comprise a plurality of grooves, the plurality of grooves comprising the first groove.

A subset or all of the plurality of grooves may form a grid pattern.

A subset or all of the plurality of grooves may form a radial pattern.

A subset or all of the plurality of grooves may form a circular pattern.

The first housing electrode may comprise first and second sub-electrodes which are stacked on top of one another. This means that one of the sub-electrodes would be arranged between the semiconductor units and the other of the sub-electrodes. The groove may be arranged at a surface of the first sub-electrode, and a surface of the second sub-electrode may comprise a further groove.

A width of the further groove may be less than a spacing between the first and second pillars.

Locations of the groove and the further groove may be aligned with one another. By the expression "aligned with", it is meant that the locations of the groove and the further groove are substantially coincident when viewed along a direction which is perpendicular to the surface of the first/ second sub-electrode The first sub-electrode may be coupled to the second sub-electrode by pressure.

Each of the semiconductor units may comprise a semiconductor chip. The semiconductor chip may be selected from a group consisting of a thyristor, a diode, and a transistor.

At least one of the semiconductor units may further comprise a strain buffer arranged between a surface of the respective semiconductor chip and the first housing electrode.

The housing may further comprise an electrical insulator arranged between the first and second housing electrodes.

The second housing electrode may comprise a further groove. A width of the further groove may be less than a spacing between the first and second pillars.

Where appropriate any of the optional features described above in relation to the groove of the first housing electrode may be applied to the further groove of the second housing electrode.

The housing may further comprise a first flange connecting the first housing electrode to the electrical insulator, and a second flange connecting the second housing electrode to the electrical insulator.

The housing may be hermetic.

The strain buffer described above may be a first strain buffer arranged between a first surface of the respective semiconductor chip and the first housing electrode. At least one of the semiconductor units may further comprise a second strain buffer arranged between a second surface of the respective semiconductor chip and the second housing electrode, the second surface being opposite to the first surface.

The semiconductor device may be a power semiconductor device. At least one of the plurality of semiconductor units is a power semiconductor unit comprising a power semiconductor chip.

According to a second aspect of the present disclosure, there is provided a method of manufacturing a semiconductor device, comprising:

providing a housing, wherein the housing comprises a first housing electrode and a second housing electrode arranged at opposite sides of the housing;

arranging a plurality of semiconductor units within the housing between the first and second housing electrodes; and coupling at least one of the first and second housing electrodes to the plurality of semiconductor units by pressure;

wherein the plurality of semiconductor units comprise a first semiconductor unit and a second semiconductor unit neighbouring the first semiconductor unit, and wherein the first and/or second housing electrode comprises a plurality of pillars, and the plurality of pillars comprise a first pillar and a second pillar electrically coupled to the first and second semiconductor units, respectively; and wherein a surface of the first housing electrode comprises a groove, and a width of the groove is less than a spacing between the first pillar and the second pillar.

According to a third aspect of the present disclosure, there is provided a semiconductor device, comprising: a housing comprising a first housing electrode and a second housing electrode which are arranged at opposite sides of the housing; and a plurality of semiconductor units arranged within the housing between the first and second housing electrodes and coupled to at least one of the first and second housing electrodes by pressure, wherein a surface of the first housing electrode comprises a groove, and a width of the groove is less than or equal to approximately 2 millimetres.

Where appropriate any of the optional features described above in relation to one of the aspects of the present disclosure may be applied to another one of the aspects of the disclosure.

The term "about" or "approximately" used in the present disclosure indicate a degree of variability (e.g., 20%) in the stated numerical values.

BRIEF DESCRIPTION OF THE DRAWINGS

In order that the disclosure may be more fully understood, a number of embodiments of the disclosure will now be described, by way of example, with reference to the accompanying drawings, in which:

FIG. 6 schematically illustrates a partial sectional view of a semiconductor device according to a second embodiment of the present disclosure;

FIG. 7 is a plan view of an upper part of the semiconductor device of FIG. 5;

FIG. 8 is a plan view of a lower part of the semiconductor device of FIG. 5;

FIG. 9 is an alternative plan view of the lower part of the semiconductor device of FIG. 5;

FIG. 10 schematically illustrates a sectional view of a semiconductor device according to a third embodiment of the present disclosure;

FIG. 11 shows process steps of a method for manufacturing a semiconductor device.

In the figures, like parts are denoted by like reference numerals.

It will be appreciated that the drawings are for illustration purposes only and are not drawn to scale.

DETAILED DESCRIPTION OF THE PREFERRED EMBODIMENTS

Figure 5:
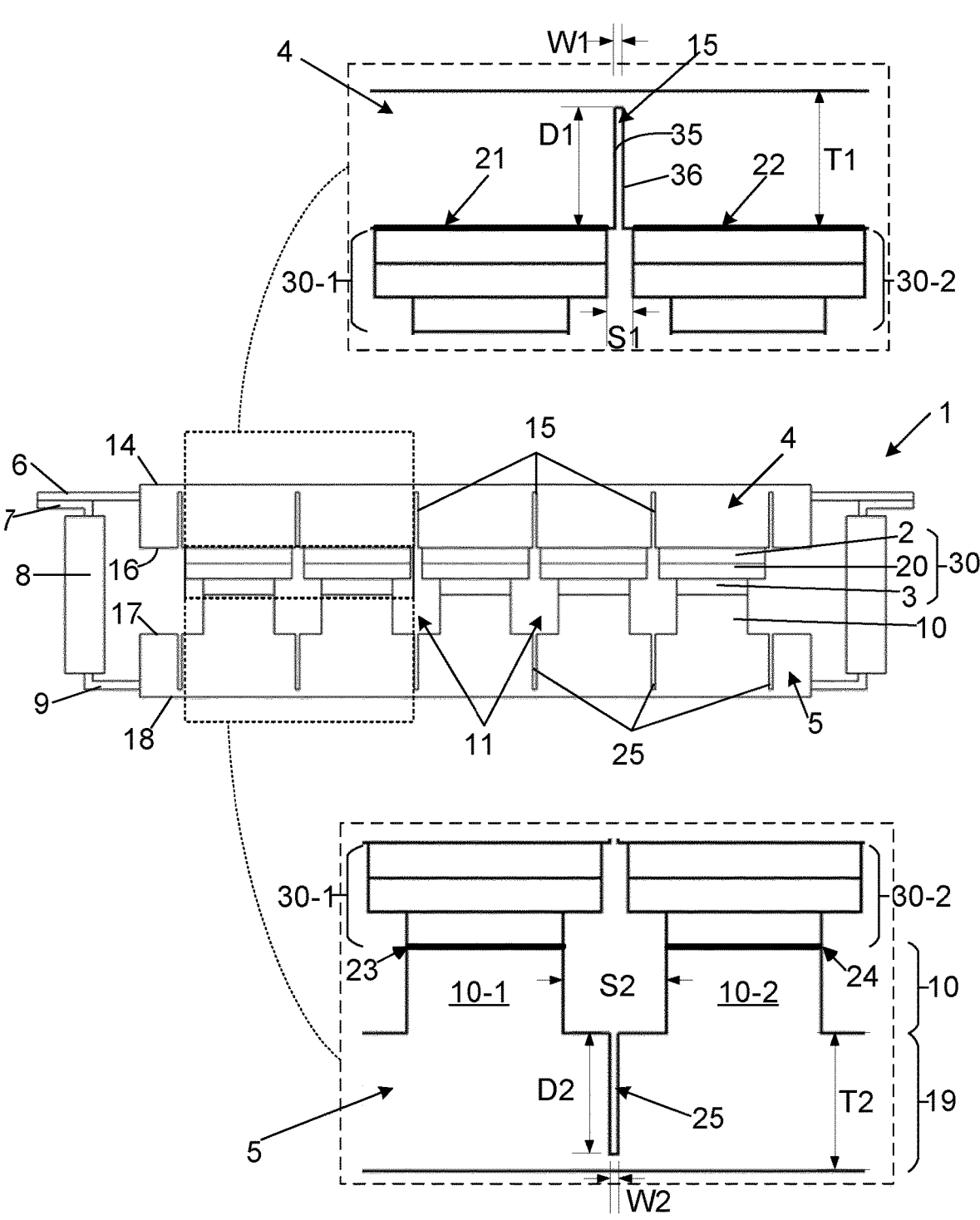
FIG. 5 schematically illustrates a sectional view of a semiconductor device according to a first embodiment of the present disclosure.

FIG. 5 schematically illustrates a cross sectional view of a semiconductor device 1 (referred to as the "device" below)

according to a first embodiment of the present disclosure. In this example, the semiconductor device 1 is embodied as a multi-chip press-pack power semiconductor device.

As shown in FIG. 5, the device 1 comprises an upper electrode 4 and a lower electrode 5 arranged at opposite sides of the device 1. The upper electrode 4 and the lower electrode 5 may also be referred to as housing electrodes. Either one of the electrodes 4, 5 may be referred to as a "first housing electrode", with the other referred to as a "second housing electrode". The device 1 further comprises upper strain buffers 2, lower strain buffers 3, and a plurality of power semiconductor chips 20 (referred to as the "chips" below). The upper strain buffers 2 and the lower strain buffers 3 are arranged at opposite surfaces of the chips 20. The upper and lower electrodes 4, 5 are typically made of copper. The upper strain buffers 3 and the lower strain buffers 4 are typically made of molybdenum. The power semiconductor chips 20 may be made in silicon technology, or alternatively may be based upon other types of semiconductors, such as, silicon carbide, gallium nitride, or silicon germanium etc. The chips 20 may comprise one or more of a power transistor (e.g., an IGBT, a power MOSFET, a power BJT), a power diode, and a power thyristor (e.g., an IGCT, a GTO) etc.

During operations of the device 1, the device 1 heats and cools, and consequently each component of the device 1 undergoes thermal expansion and contraction. Difference in the thermal expansion coefficients of adjacent components leads to abrasive wear (also called "fretting") of their contact surfaces. The thermal expansion coefficients of silicon and molybdenum are more closely matched than those of silicon and copper. The strain buffers 2, 3 are useful for reducing the rate of wear on the surfaces of the chips 20. The chips 20 may be silver sintered (or otherwise bonded) to the strain buffers 2, 3 to further reduce the risks of fretting and reduce the thermal resistance of the chips 20. A combination of a single chip 20 with its associated strain buffers 2, 3 may be referred to as a semiconductor unit 30. It would, however, be appreciated that the strain buffers 2, 3 may be wholly or partly omitted from the semiconductor units 30. As shown by FIG. 5, the semiconductor units 30 are laterally spaced to one another.

The device 1 further includes a lid flange 6, a housing upper flange 7, an electrical insulator 8, and a housing lower flange 9. These components form a gas-tight (or hermetic) connection between the upper electrode 4 and the lower electrode 5. The lid flange 6 and the housing upper flange 7 connect the upper electrode 4 with the electrical insulator 8. The housing lower flange 9 connects the lower electrode 5 with the electrical insulator 8. The electrodes 4, 5, the flanges 6, 7, 9 as well as the electrical insulator 8 together form a hermetic housing of the device 1. The semiconductor units 30 are located within the housing between the upper and lower electrodes 4, 5. The housing encloses an internal space 11 which is typically filled with an inert gas (e.g., nitrogen) at a suitable pressure (e.g., approximately one standard atmospheric pressure) to ensure reliable operation of the chips 20. While FIG. 5 shows that the internal space 11 includes separate sections located at opposite sides of each semiconductor unit 30, it would be understood that the separate sections are in fact interconnected in the third dimension relative to the cross-sectional plane of FIG. 5.

The electrical insulator 8 electrically isolates the upper electrode 4 from the lower electrode 5. The electrical insulator 8 may have a tubular or cylindrical shape and comprises an electrically insulating material (e.g., ceramic). It would be appreciated that the electrical insulator 8 may comprise electrically conductive material(s) as far as the electrically conductive material(s) do not form a conducting path between the housing electrodes 4, 5. The electrical insulator 8 typically surrounds the semiconductor units 30. The flanges 6, 7, and 9 may be made of copper or nickel-iron.

The upper electrode 4 comprises an inner surface 16 facing the semiconductor units 30 and an outer surface 14 opposite to the inner surface 16. In the example of FIG. 5, the upper electrode 4 is an electrode plate which has flat inner and outer surfaces 14, 16. The lower electrode 5 may be considered as comprising an electrode plate 19 (which has flat surfaces, as shown in the lower inset) and an array of pillars 10 integrally joining with the electrode plate 19. The electrode plate 19 comprises an inner surface 17 facing the semiconductor units 30 and an outer surface 18 opposite to the inner surface 17. The outer surfaces 14, 18 are exposed to an exterior of the device 1. The array of pillars 10 extend from the inner surface 17 of the electrode plate 19 into the internal space 11. The pillars 10 form contacts with the lower strain buffers 3 of the semiconductor units 30. The semiconductor units 30 have upper and lower contact regions of differing areas. The pillars 10 of the lower electrode 5 permit contact to the smaller area at the bottom surfaces of the semiconductor units 30.

At least one of the upper and lower electrodes 4, 5 forms a pressure contact with the semiconductor units 30. "Pressure contact" means that at least one of the upper and lower electrodes 4, 5 is coupled to the semiconductor units 30 by pressure only, without requiring any bonding material. In other words, dry interfaces exist between the semiconductor units 30 and the upper electrode 4, and/or between the semiconductor units 30 and the pillars 10 of the lower electrode 5. The remaining one (if any) of the upper and lower electrodes 4, 5 may be fixedly bonded to the semiconductor units 30, by for example using a bonding material. By clamping the semiconductor units 30 between the housing electrodes 4, 5, an electrical and thermal conducting path is established between the housing electrodes 4, 5 through the chips 20. In particular, upper sides of the chips 20 are electrically and thermally coupled to the upper electrode 4. Lower sides of the chips 20 are electrically and thermally coupled to the pillars 10 of the lower electrode 5.

With reference to the upper inset of FIG. 5, the semiconductor units 30 comprise a first semiconductor unit 30-1, and a second semiconductor unit 30-2 which neighbours the first semiconductor unit 30-1. The upper electrode 4 comprises a first area 21 coupled to the first semiconductor unit 30-1, and a second area 22 coupled to the second semiconductor unit 30-2. In the event that the upper electrode 4 forms a pressure contact with the semiconductor units 30, the first area 21 and the second area 22 would directly contact the semiconductor units 30-1, 30-2, respectively. In the event that the upper electrode 4 is fixedly bonded to the semiconductor units 30, the first area 21 and the second area 22 may be attached to the semiconductor units 30-1, 30-2 by a bonding material. The first area 21 and the second area 22 are provided on the inner surface 16 of the upper electrode 4 and have a spacing (i.e., edge-to-edge distance) of S1 between each other. As shown in the example of FIG. 5, the first and second semiconductor units 30-1, 30-2 as well as the chips 20 thereof also have a spacing of S1. The upper electrode 4 comprises a groove 15 located between the first area 21 and the second area 22. In the example of FIG. 5, the groove 15 is formed at the inner surface 16 of the upper electrode 4, and the groove 15 has a width W1 which is less than the spacing S1. The groove 15 also has a depth D1 which is less than a thickness T1 of the upper electrode 4. The groove 15 has a longitudinal direction or a centre line (not labelled) which is perpendicular to the cross-sectional plane of FIG. 5. A length or a path of the groove 15 is defined along the longitudinal direction. The width W1 of the groove 15 represents the shortest distance between two opposing side walls 35, 36 of the groove 15, and is typically measured along a direction that is perpendicular to the longitudinal direction of the groove and parallel to the inner surface 16 of the upper electrode. The depth D1 of the groove 15 is measured along a direction that is perpendicular to the inner surface 16 of the upper electrode.

The depth D1 of the groove 15 may be equal to or greater than 50% of the thickness T1, and, more preferably, may be maximised to leave a minimum amount of remaining electrode material. In an example, a thickness of the remaining electrode material (i.e., T1 minus D1) may be in the order of approximately 1.0 mm. In this way, the groove 15 effectively splits the bulk of the upper electrode 4 into separate regions connected by a thin section of remaining electrode material, thereby weakening the upper electrode 4 and preventing the upper electrode 4 from acting as a single electrode plate in response to thermal gradients. Consequently, the groove 15 reduces the forces generated by thermal warpage of the upper electrode 4, and improves the pressure uniformity across the chips 20. Since the groove 15 does not extend through the entire thickness T1 of the upper electrode 4, the upper electrode 4 remains as a single-piece electrode.

The groove 15 may be formed by a material removal process (e.g., milling, drilling, turning etc.). The width W1 of the groove 15 may be as narrow as possible. A narrow width W1 reduces the amount of material removed from the upper electrode 4 and allows the upper electrode 4 to maintain a low thermal resistance as well as a low electrical resistance. A narrow width W1 further reduces the amount of processing time incurred for forming the groove 15 in the upper electrode 4. Generally speaking, the minimum value of W1 is determined by the availability of appropriate machine tools. For example, if the groove 15 is formed by milling, a cutting tool of at least 1 mm in diameter may be needed in order to achieve a groove depth (i.e., D1) of a few millimetres. This means that the width W1 of the groove 15 may be at least 1 mm approximately. The width W1 of the groove 15 may not exceed approximately 2 mm, in order to avoid significantly increasing the thermal and electrical resistances of the upper electrode 4.

With reference to the lower inset of FIG. 5, the lower electrode 5 comprises a third area 23 coupled to the first semiconductor unit 30-1, and a fourth area 24 coupled to the second semiconductor unit 30-2. The third area 23 and the fourth area 24 are provided by the surfaces of two neighbouring pillars 10-1, 10-2, which have a spacing (i.e., edge-to-edge distance) of S2 between each other. In the event that the lower electrode 5 forms a pressure contact with the semiconductor units 30, the third and fourth areas 23, 24 would directly contact the semiconductor units 30-1, 30-2, respectively. In the event that the lower electrode 5 is fixedly bonded to the semiconductor units 30, the third and fourth areas 23, 24 may be coupled to the semiconductor units 30-1, 30-2 by a bonding material. The lower electrode 5 also comprises a groove 25 located between the third area 23 and the fourth area 24. In the example of FIG. 5, the groove 25 is formed at the inner surface 17 of the electrode plate 19. The groove 25 has a width W2 which is less than the spacing S2. In a typical example, the spacing S2 between the neighbouring pillars 10-1, 10-2 may be around 5 mm, and the width W2 of the groove 25 may not exceed 2 mm, in order to allow the lower electrode 5 to have relatively low thermal and electrical resistances. The groove 25 also has a depth D2 which is less than a thickness T2 of the electrode plate 19. The width W2 and the depth D2 of the groove 25 are measured in a similar way to the width W1 and the depth D1 of the groove 15.

The features and advantages described above with reference to the groove 15 are generally applicable to the groove 25. More specifically, the depth D2 of the groove 25 may be equal to or greater than 50% of the thickness T2 of the electrode plate 19, and, more preferably, may be maximised to leave a minimum amount (e.g., a thickness in the order of approximately 1 mm) of remaining electrode material. Further similar to the groove 15, the width W2 of the groove 25 may be as narrow as possible (e.g., equal to or less than 2 mm) as determined by the availability of appropriate machine tools used to make the groove 25. As a result, the groove 25 reduces the strength of thermal warpage forces experienced by the electrode plate 19 of the lower electrode 5 and improves the pressure uniformity across the chips 20, while the lower electrode 5 remains as a single-piece electrode that retains a low thermal resistance.

FIG. 5 shows that the groove 15 has equal distances to the first area 21 and second area 22, and that the groove 25 has equal distances to the third area 23 and fourth area 24. It would however be appreciated that the groove 15 and/or the groove 25 may be offset from a centre location between the adjacent chip contact areas. Further, while FIG. 5 shows that a groove 15 (or a groove 25) is provided between any adjacent pair of the semiconductor units 30, it would be understood that some of the grooves 15 (or the grooves 25) may be omitted, depending upon a desired pattern of the grooves. In addition, FIG. 5 shows that the grooves 15 and the grooves 25 are aligned with one another along a vertical direction. It would be appreciated that this arrangement is not necessary. The grooves 15, 25 are generally independent from one another and may have different dimensions, be provided on different locations on the respective electrode plate, and/or form different patterns on the respective electrode plate. This is described in more detail below with reference to FIGS. 7 to 9.

In the example of FIG. 5, the width W1 of the groove 15 in the upper electrode 4 is less than the spacing S1 between the neighbouring semiconductor units 30-1, 30-2. However, the width W1 may also be greater than the spacing between neighbouring units. FIG. 6 illustrates a partial sectional view of a semiconductor device 1A according to a second embodiment of the present disclosure. Elements of the device 1A that are identical to those of the device 1 are identified using the same labels. Elements of the device 1A that correspond to, but are different from those of the device 1 are labelled using the same numerals but with a letter 'A' for differentiation. The features and advantages described above with reference to the first embodiment are generally applicable to the second embodiment. The partial sectional view of FIG. 6 generally corresponds to the upper inset of FIG. 5.

In FIG. 6, a groove 15A is formed at the inner surface 16 of the upper electrode 4, and the groove 15A has a longitudinal direction or a centre line P which is perpendicular to the cross-sectional plane of FIG. 6. The groove 15A has a width W1 which is equal to the spacing S1 between the first area 21 and the second area 22. Meanwhile, the first and second semiconductor units 30-1, 30-2 as well as the chips 20 thereof have a spacing of C1, which is less than S1 or W1. For instance, the spacing C1 may be 0.4 mm, and the width W1 of the groove 15A may be around or greater than 1.0 mm. The small spacing C1 between the neighbouring semiconductor units allows more chips 20 to be packaged within the housing of the device 1 under a given housing size. As such, the semiconductor units 30-1, 30-2 extend over the sidewalls 35, 36 of the groove 15A, respectively, and the edges of the semiconductor units 30-1, 30-2 do not directly contact the upper electrode 4. Since the edge of a semiconductor unit is generally cooler than its centre, the chip centre temperature is still the limiting factor in device performance. Therefore, removing small amounts of contact areas at the edges would not have significantly detrimental effects on the performance of the semiconductor units 30-1, 30-2. In addition, as shown in FIG. 6, the upper strain buffers 2A typically have rounded edges, which may have a radius of 0.2 mm. Therefore, the minimum achievable spacing between the first and second areas 21, 22 is approximately 0.8 mm, which is on a similar scale to the width W1 of the groove 15A. In any event, the width W1 of the groove 15A is much less than the spacing S2 between adjacent pillars 10-1, 10-2 (which are electrically and thermally coupled to the bottom surfaces of the semiconductor units 30-1, 30-2, respectively). The centre line P of the groove 15A may be equidistant from the semiconductor units 30-1, 30-2.

During the manufacture of the device 1 (or 1A), a predetermined pattern of grooves (e.g., the grooves 15, 15A, 25) may be cut into the respective inner surface (e.g., the surfaces 16, 17) of either or both of the housing electrodes 4, 5. The pattern may be determined through consideration of the layout pattern of the chips 20 within the device 1 and how the respective electrode plate of the housing electrode can be most efficiently weakened. A number of exemplary patterns are illustrated by FIGS. 7 to 9 and described below.

FIG. 7 shows a grid pattern of the grooves 15 on the inner surface 16 of the upper electrode 4. FIG. 7 also shows the locations of the upper strain buffers 2 projected onto the inner surface 16 of the upper electrode 4. It would be understood that the projected locations of the upper strain buffers 2 represent the chip contact areas (e.g., 21, 22) of the upper electrode 4 that contact the semiconductor units 30. The grid pattern of the grooves 15 generally follows the layout of the chips 20 and comprises a plurality of grooves each extending along a straight path. In the example of FIG. 7, a groove 15 is provided between any adjacent pair of the chip contact areas, and each chip contact area is surrounded by grooves 15 at all four sides. It would be appreciated that the grid pattern may be modified by removing some of the lines so as to achieve a larger grid size. Generally speaking, the grid pattern is the most universal pattern and can be used for any chip layouts.

FIG. 8 shows a circular pattern of the grooves 25 on the inner surface 17 of the electrode plate 19 of the lower electrode 5. FIG. 8 also shows the locations of the pillars 10 projected onto the inner surface 17 of the electrode plate 19. It would be understood that the projected locations of the pillars 10 represent the chip contact areas of the lower electrode 5 that contact the semiconductor units 30. In the example of FIG. 8, the chip contact areas are separated into two groups by an inner circular groove, and an outer circular groove with a larger radius is provided to surround all of the chip contact areas. The inner and outer circular grooves are concentric. With reference to FIG. 8, it can be seen that the inner circular groove does not have equal distances to adjacent pairs of chip contact areas located at opposite sides of the inner circular groove. While the circular pattern shown by FIG. 8 includes two concentric circular grooves, it would be appreciated that the number of circular grooves may vary and the grooves may not be concentric.

FIG. 9 shows an alternative radial pattern of the grooves 25 on the inner surface 17 of the electrode plate 19 of the lower electrode 5. The radial pattern comprises a number of grooves which extend outwards from the centre to the perimeter of the inner surface 17 of the electrode plate 19. In the example of FIG. 9, the radial pattern includes four straight grooves dividing the inner surface 17 into four quadrants. It would be understood that the number of grooves within the radial pattern may vary, thereby creating circular sectors with different central angles on the inner surface 17.

It would be appreciated that the patterns of grooves shown by FIGS. 7 to 9 are merely examples, and that alternative patterns of the grooves 15, 25 may be used. Further, a mixture of the patterns may be used on the same housing electrode. For example, both radial and circular patterns of the grooves 25 may be formed on the inner surface 17 of the lower electrode 5. In practice, the choice of pattern may be the one that gives acceptable resistance to thermal warpage with the minimum material removal.

In the examples provided by FIGS. 5 to 9, the groove(s) 15 is located between adjacent chip contact areas (e.g., 21, 22) on the inner surface 16 of the upper electrode 4, and the groove(s) 25 is located between adjacent chip contact areas (e.g., 23, 24) on the inner surface 17 of the lower electrode 5. Generally speaking, when a groove is formed at an inner surface of a housing electrode which also contacts the semiconductor units 30, it is preferable (although not necessary) that the groove does not extend through the chip contact areas. In this way, the groove would not significantly impact the interface between any semiconductor unit and the corresponding housing electrode.

Alternatively, a groove may be formed at an outer surface of a housing electrode. This is described in more detail with reference to FIG. 10. FIG. 10 schematically illustrates a cross sectional view of a semiconductor device 1B according to a third embodiment of the present disclosure. Elements of the device 1B that are identical to those of the device 1 are identified using the same labels. Elements of the device 1B that correspond to, but are different from those of the device 1 are labelled using the same numerals but with a letter 'B' for differentiation. The features and advantages described above with reference to the first embodiment are generally applicable to the third embodiment.

The device 1B differs from the device 1 of FIG. 5 in that the upper electrode 4B comprises grooves 15B cut into its outer surface 14, and the lower electrode 5B comprises grooves 25B cut into its outer surface 18. The grooves 15B, 25B are otherwise identical to the grooves 15, 25, respectively. There are no obstructions (e.g., chip contact areas, pillars, etc.) present on the outer surfaces 14, 18 of the housing electrodes 4B, 5B. Therefore, a user would have greater freedom in designing the patterns of the grooves 15B or 25B, irrespective of the layout of the chips 20 within the device 1A.

Figures 1, 2, 3, 4:
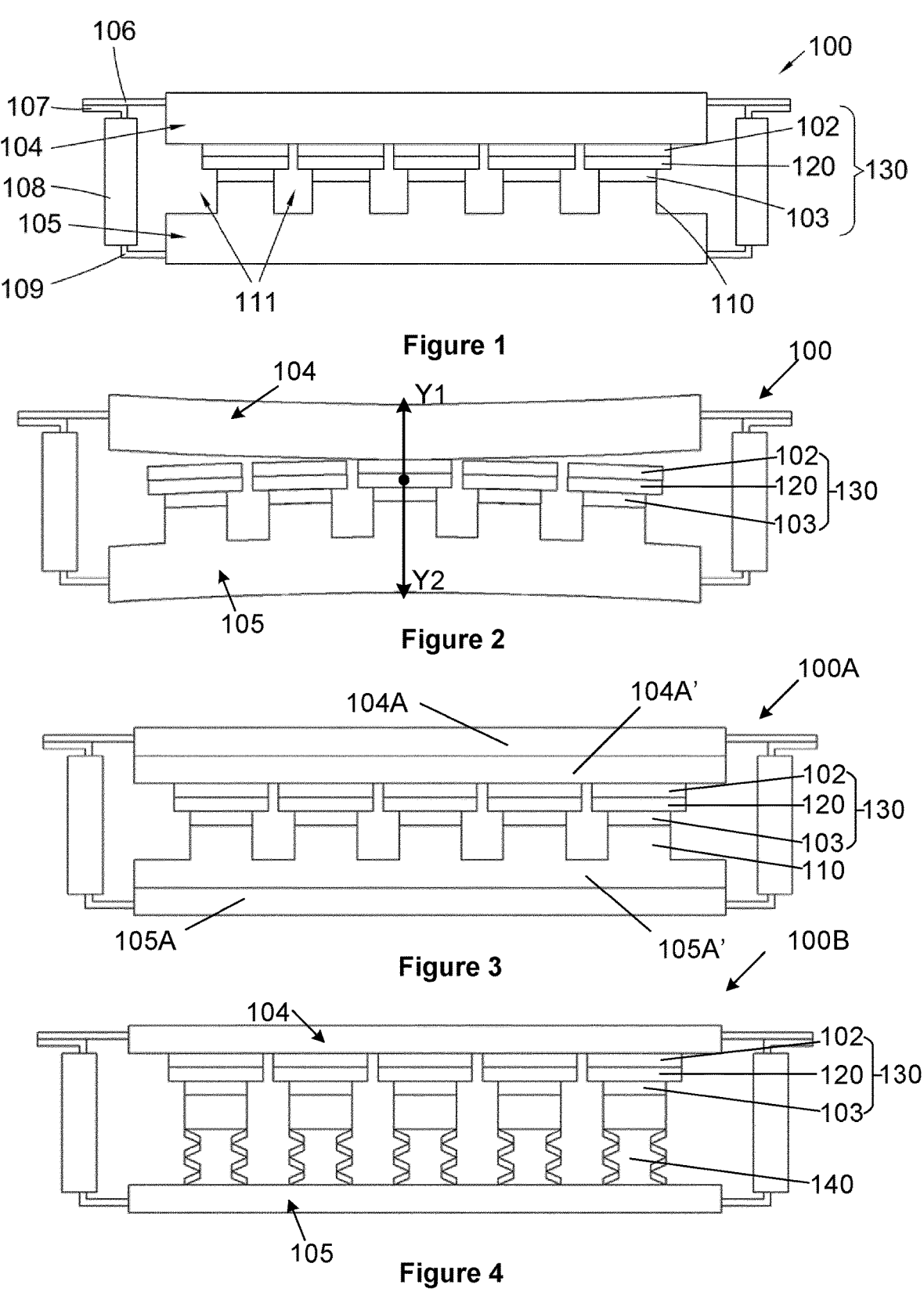
FIG. 1 schematically illustrates a sectional view of a prior semiconductor device.
FIG. 2 schematically illustrates thermal warpage experienced by the housing electrodes of the prior semiconductor device of FIG. 1.
FIG. 3 schematically illustrates a sectional view of another prior semiconductor device.
FIG. 4 schematically illustrates a sectional view of another prior semiconductor device.

In the examples described above, each of the housing electrodes 4, 5, 4B, 5B is a single-piece electrode. It is also possible to split the housing electrode horizontally into two or more thinner sub-electrodes (similar to FIG. 3), each with at least one groove (similar to 15, 15A, 15B, 25 or 25B) cut into its surface. This arrangement may be useful if the desired groove depth cannot be achieved on a single-piece electrode. For example, if the thickness of the upper electrode 4 is 12 mm, the desired groove depth D1 may be approximately 11 mm. If a user does not have available machine tools to produce such a deep groove, it is an option to split the upper electrode into two thinner sub-electrodes, each with a thickness of 6 mm. A groove with a depth of approximately 5 mm may be easily cut into a surface of each sub-electrode using available tools.

In use, the two (or more) sub-electrodes are stacked on top of one another and have a dry interface therebetween. As compared to the prior solution illustrated by FIG. 3, the groove formed in each sub-electrode significantly reduce the strength of thermal warpage forces experienced by the housing electrode and improves the pressure uniformity across the chips 20. The grooves of the sub-electrodes may be aligned and/or follow the same pattern, so as to mimic a deep groove which should have been cut into a single-piece electrode.

FIG. 11 schematically illustrates processing steps of a method for manufacturing a semiconductor device (e.g., the device 1, 1A or 1B).

At step S1, a housing is provided. The housing comprises a first housing electrode (e.g., the upper electrode 4, 4B or the lower electrode 5, 5B) and a second housing electrode (e.g., the lower electrode 5, 5B or the upper electrode 4, 4B) arranged at opposite sides of the housing.

At step S2, a plurality of semiconductor units (e.g., the semiconductor units 30) are arranged within the housing between the first and second housing electrodes. The plurality of semiconductor units comprises a first semiconductor unit (e.g., 30-1) and a second semiconductor unit (e.g., 30-2) neighbouring the first semiconductor unit. The plurality of semiconductor units may be laterally spaced to one another.

At step S3, at least one of the first and second housing electrodes is coupled to the plurality of semiconductor units by pressure. This means that a pressure contact is formed between the plurality of semiconductor units and at least one of the first and second housing electrodes. The first and/or second housing electrode comprises a plurality of pillars (e.g., the pillars 10), and the plurality of pillars comprise a first pillar (e.g., 10-1) and a second pillar (e.g., 10-2) electrically coupled to the first and second semiconductor units, respectively. A surface (e.g., the surface 14, 16, 17 or 18) of the first housing electrode further comprises a groove (e.g., the groove 15, 15A, 15B, 25, or 25B), and a width (e.g., W1 or W2) of the groove is less than a spacing (e.g., S2) between the first and second pillars.

It would be appreciated that the steps may be performed in a temporal order that is different from the order of description. For example, step S1 may comprise two substeps, which provide a first part and a second part of the housing, respectively, and steps S2 and S3 may be performed between the two sub-steps.

The examples illustrated by FIGS. 5 and 10 require that each of the housing electrodes 4, 5 (or 4B, 5B) has groove(s) formed thereon. This arrangement greatly reduces the strength of thermal warpage forces experienced by each housing electrode and ensures the pressure uniformity across the chips 20. It would however be appreciated that groove(s) may be omitted from one housing electrode. Having groove (s) cut into one electrode is still useful for reducing the gross imbalance in contact pressure between the chips 20.

Further, the examples of FIGS. 5 and 10 show that one housing electrode (e.g., 4, 4B) has flat surfaces and resembles an electrode plate, and the other housing electrode (e.g., 5, 5B) has an electrode plate 19 and an array of pillars 10 extending from the inner surface 17 of the electrode plate 19. It would be appreciated that each of the housing electrodes may have an array of pillars formed on its inner surface 17 for contacting the semiconductor units 30.

In addition, while FIGS. 5 to 10 relate to multi-chip press-pack power semiconductor devices, it would be appreciated that the grooves 15, 15A, 15B, 25 and/or 25B may be used in a housing electrode of any pressure-contact semiconductor device.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The skilled person will understand that in the preceding description and appended claims, positional terms such as 'upper', 'lower', 'top', 'bottom', 'lateral', 'vertical', 'horizontal' etc. are made with reference to conceptual illustrations of a semiconductor device, such as those showing standard layout plan views and those shown in the appended drawings. These terms are used for ease of reference but are not intended to be of limiting nature. These terms are therefore to be understood as referring to a semiconductor device when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

The invention claimed is:

1. A semiconductor device, comprising:
a housing comprising a first housing electrode and a second housing electrode which are arranged at opposite sides of the housing; and
a plurality of semiconductor units arranged within the housing between the first and second housing electrodes and coupled to at least one of the first and second housing electrodes by pressure contact, wherein the plurality of semiconductor units comprise a first semiconductor unit and a second semiconductor unit neighbouring the first semiconductor unit;
wherein the first housing electrode comprises:
an electrode plate having an inner surface and an outer surface which is opposite to the inner surface, the inner surface facing an interior of the housing;
a plurality of pillars extending from the inner surface of the electrode plate along a first direction into the interior of the housing, wherein the plurality of pillars comprise a first pillar and a second pillar separated in a second direction orthogonal to the first direction and electrically coupled to the first and second semiconductor units, respectively; and
a groove extending in a third direction from the inner surface of the electrode plate into the electrode plate, the third direction being opposite the first direction, wherein a width of the groove in the second direction is less than a spacing between the first pillar and the second pillar and greater than a spacing between the first and second semiconductor units, and the groove has a depth in the third direction which is less than a thickness of the electrode plate between the inner surface and the outer surface.

2. The semiconductor device according to claim 1, wherein the depth of the groove is equal to or greater than approximately 50% of the thickness of the electrode plate.

3. The semiconductor device according to claim 2, wherein the depth of the groove is less than the thickness of the electrode plate by approximately 1 millimetre or more.

4. The semiconductor device according to claim 1, wherein the width of the groove is less than or equal to approximately 2 millimetres.

5. The semiconductor device according to claim 1, wherein the first housing electrode comprises a first area and a second area contacting the first and second semiconductor units, respectively, and the groove is arranged between the first area and the second area.

6. The semiconductor device according to claim 1, wherein a centre line of the groove is equidistant from the first and second semiconductor units.

7. The semiconductor device according to claim 1, wherein the groove extends along a circular path on the inner surface of the electrode plate of the first housing electrode.

8. The semiconductor device according to claim 1, wherein the groove extends along a straight path.

9. The semiconductor device according to claim 1, wherein the groove is a first groove, and the first housing electrode comprises a plurality of grooves, the plurality of grooves comprising the first groove.

10. The semiconductor device according to claim 9, wherein a subset or all of the plurality of grooves form one or more of: a grid pattern, a radial pattern and a circular pattern.

11. The semiconductor device according to claim 1, wherein the first housing electrode comprises first and second sub-electrodes which are stacked on top of one another, and wherein the groove is arranged at a surface of the first sub-electrode, and a surface of the second sub-electrode comprises a further groove.

12. The semiconductor device according to claim 11, wherein the first sub-electrode is coupled to the second sub-electrode by pressure.

13. The semiconductor device according to claim 1, wherein each of the semiconductor units comprises a semiconductor chip.

14. The semiconductor device according to claim 13, wherein at least one of the semiconductor units further comprises a strain buffer arranged between a surface of the respective semiconductor chip and the first housing electrode.

15. The semiconductor device according to claim 1, wherein the housing further comprises an electrical insulator arranged between the first and second housing electrodes.

16. The semiconductor device according to claim 1, wherein:
a surface of the second housing electrode comprises a further groove; and
a width of the further groove is less than the spacing between the first and second pillars.

17. A method of manufacturing a semiconductor device, comprising:
providing a housing, wherein the housing comprises a first housing electrode and a second housing electrode arranged at opposite sides of the housing;
arranging a plurality of semiconductor units within the housing between the first and second housing electrodes; and
coupling at least one of the first and second housing electrodes to the plurality of semiconductor units by pressure contact;

wherein the plurality of semiconductor units comprise a first semiconductor unit and a second semiconductor unit neighbouring the first semiconductor unit, and wherein the first housing electrode comprises:

an electrode plate having an inner surface and an outer surface which is opposite to the inner surface, the inner surface facing an interior of the housing;

a plurality of pillars extending from the inner surface of the electrode plate into the interior of the housing along a first direction, wherein the plurality of pillars comprise a first pillar and a second pillar separated in a second direction orthogonal to the first direction and electrically coupled to the first and second semiconductor units, respectively; and a groove extending in a third direction from the inner surface of the electrode plate into the electrode plate, the third direction being opposite to the first direction, wherein a width of the groove in the second direction is less than a spacing between the first pillar and the second pillar and greater than a spacing between the first and second semiconductor units, and the groove has a depth in the third direction which is less than a thickness of the electrode plate between the inner surface and the outer surface.

* * * * *